(12) United States Patent
Kato

(10) Patent No.: US 6,224,667 B1
(45) Date of Patent: May 1, 2001

(54) METHOD FOR FABRICATING SEMICONDUCTOR LIGHT INTEGRATED CIRCUIT

(75) Inventor: Tomoaki Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/943,099

(22) Filed: Sep. 15, 1997

Related U.S. Application Data

(63) Continuation of application No. 08/364,999, filed on Dec. 28, 1994, now abandoned.

(30) Foreign Application Priority Data

Dec. 28, 1993 (JP) .................................................. 5-334641

(51) Int. Cl.$^7$ ................................................ C30B 25/02
(52) U.S. Cl. ............................ 117/84; 438/267; 438/289; 438/293
(58) Field of Search ............................. 117/84; 438/293, 438/289, 267

(56) References Cited

U.S. PATENT DOCUMENTS

| | | | |
|---|---|---|---|
| 4,855,255 | * 8/1989 | Goodhue | 437/129 |
| 5,250,462 | 10/1993 | Sasaki et al. | 437/89 |
| 5,288,659 | * 2/1994 | Koch et al. | 437/129 |

FOREIGN PATENT DOCUMENTS

| | | |
|---|---|---|
| 525 779 | 2/1993 | (EP) . |
| 4-100291 | 2/1992 | (JP) . |
| 9309569 | * 5/1993 | (WO) . |
| WO 93/22793 | 11/1993 | (WO) . |

OTHER PUBLICATIONS

T. Kato et al., "Novel MQW DFB Laser Diode/Modulator Intergrated Light Source Using Bandgap Energy Control Epitaxial Growth Technique", 17th European Conference on Optical Communication/Integrated Optics and Optical Fiber Communication, Paris, France, 1991.

S. Takano, et al., "1.55μm Wavelength–Tunable MQW–DBR–LDs Employing Bandgap Energy Control In All Selective MOVPE Growth", 18th European Conference on Optical Communication, Berlin, Germany, 1992.

G. Coudenys, et al., "Lateral Bandgap Engineering for InP–Based Photonic Integrated Circuits," Fourth Annual Conference on Indium Phosphide and Related Materials, Apr. 1992, pp. 202–205.

Sasaki, et al., "Selective MOVPE Growth and Its Application to Semiconductor Photonic Integrated Circuits," Electronics and Communications in Japan, Part II: Electronics, vol. 76, No. 4, Apr. 1993, pp. 1–11.

IBM Technical Disclosure Bull 34(5), Oct. 1991.*

* cited by examiner

*Primary Examiner*—Robert Kunemund
(74) *Attorney, Agent, or Firm*—Foley & Lardner

(57) ABSTRACT

According to a method for fabricating a semiconductor light integrated circuit of the invention, a light waveguide layer and a clad layer are provided on a longitudinal aperture by epitaxial growth technique using a relatively low growth pressure. In contrast with those layers, a quantum well structure layer is selectively provided on the longitudinal aperture by epitaxial growth technique using a relatively high growth pressure.

7 Claims, 5 Drawing Sheets

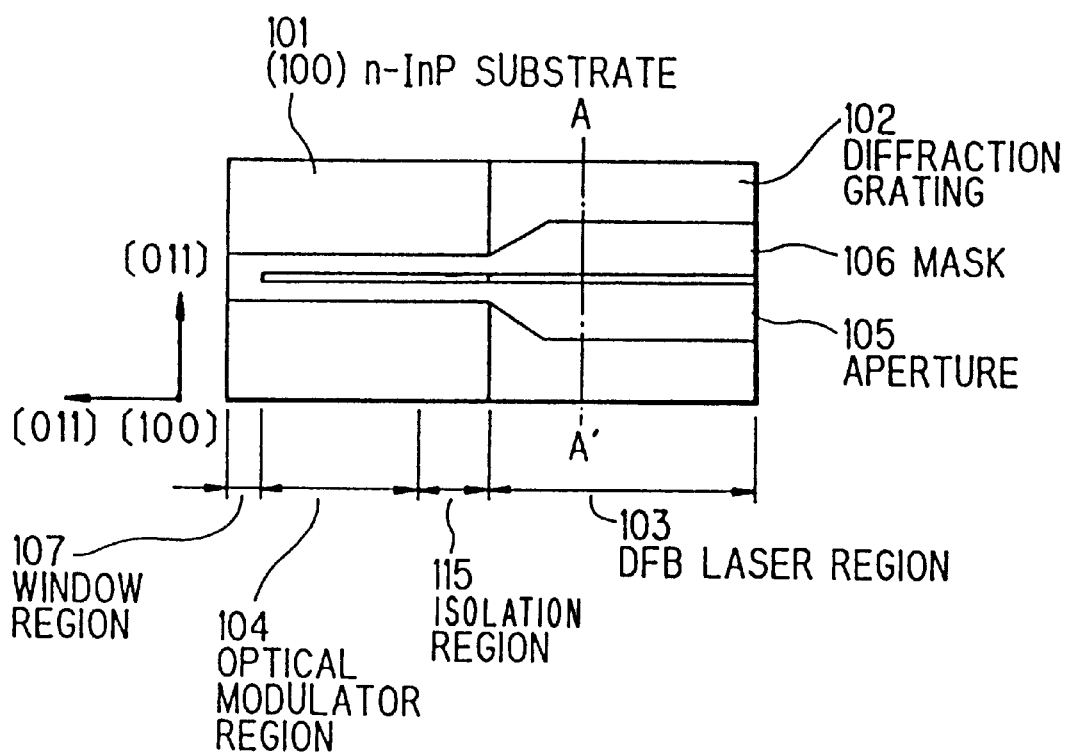

METHOD FOR FABRICATING SEMICONDUCTOR LIGHT INTEGRATED CIRCUIT

This application is a continuation of application Ser. No. 08/364,999, filed Dec. 28, 1994 now abandoned.

FIELD OF THE INVENTION

The invention relates to a method for fabricating a semiconductor photonic integrated circuit, especially to an improved method of a MOVPE (Metalorganic Vapor Phase Epitaxy) for performing epitaxial growth.

BACKGROUND OF THE INVENTION

Recently, in semiconductor fabrication technology, growth preventing masks are arranged on both sides of a stripe-shaped aperture, and a semiconductor layer is selectively epitaxial-grown on the aperture by MOVPE (Metalorganic Vapor Phase Epitaxy), which is called selective MOVPE. By this technology, a light waveguide device can be formed without an etching technique, therefore the fabrication can be simplified and the yield gets better. When the selective MOVPE technology is applied to epitaxial growth of a quantum well structure of III-V family of compound semiconductor, diffusion of growth species (mainly III family of organic metal material) in vapor phase depends on the width of masks by which the solid phase composition of the growth species varies, and the growth velocity depends on the width of the mask by which the width of the quantum well structure layer varies. Based on the synergistic effect of the above mentioned theory, bandgap energy (transmission energy in the first energy level between valence electron band and conduction band) on the same substrate can be changed by a single MOVPE growth process using a mask with different width partially. This kind of technology is good for fabrication of a semiconductor photonic integrated circuit which is required monolithic integration of optical function devices having different bandgap energy. The inventor has proposed an integrated light source and a tunable DBR (Distributed Bragg Reflection) laser each of which is fabricated by monolithic integration of an electro absorption type of optical modulator and a distributed feedback laser.

The solid phase composition and the thickness of the grown layer would be varied in response to the difference of width of the mask, even if the growth conditions are the same. This means that the thickness of the selectively grown layer varies when the mask is changed in width for control of bandgap energy, even if it is not preferable.

Practically, such a quantum well structure layer is sandwiched with doped clay layers, and current is injected or electric field is applied to the well structure for providing optical function with the well layer. In this processing, there is disadvantage in that electric characteristics, such as device resistance and reverse breakdown voltage, are changing in response to the width variation of the mask and, therefore, important parameters for reliability of the optical functional device cannot be fixed. If the thicknesses of layers are not even on each portion of the substrate, that may cause the quality of photolithography processing to deteriorate.

SUMMARY OF THE INVENTION

Accordingly, an object of the invention is to provide an improved method for fabricating a semiconductor photonic integrated circuit by which stable electrical characteristics can be provided.

Another object of the invention is to provide an improved method for fabricating a semiconductor photonic integrated circuit by which photolithography processing can be carried out precisely.

According to the invention, a method for fabricating a semiconductor photonic integrated circuit, comprises the steps of:

providing a growth preventing mask on a semiconductor substrate, the growth preventing mask being shaped with a first portion of a first width and a second portion of a second width wider than the first width, the first and second portions having a non-masking stripe aperture extending through the second portion to nearly edge of the first portion;

selectively growing a light waveguide layer on the non-masking stripe aperture of the semiconductor substrate by epitaxial growth technique using a low growth pressure, in which a thickness ratio d/do of the light waveguide layer to the second width of the growth preventing mask is smaller than 1.2;

increasing a growth pressure above the low growth pressure, such that the thickness ratio d/do is greater than 1.2;

selectively growing a multiple quantum well structure layer on the light waveguide layer by epitaxial growth techniques using a high growth pressure, in which a thickness ratio d/do of the multiple quantum well structure layer to the second width of the growth preventing mask is greater than 1.2;

decreasing the growth pressure below the high growth pressure, such that the thickness ratio d/do is smaller than 1.2; and selectively growing a clad layer on the multiple quantum well structure layer by epitaxial ground technique using a low growth pressure, in which a thickness ratio d/do of the clad layer to the second width of the growth preventing mask is smaller than 1.2;

wherein the light waveguide layer-growing step, the growth pressure-increasing step, the multiple quantum well structure pressure-decreasing step, and the clad layer-growing step are successively carried out in one MOVPE (Metalorganic Vapor Phase Epitaxy) process.

In the fabricating method as specified above, the thickness ratio is defined "normalized thickness" in the art, and "the low growth pressure" is a pressure in which the normalized thickness d/do of a selectively grown layer to a growth preventing mask width W is smaller than 1.2, while "the high growth pressure" is a pressure in which the normalized thickness d/do of a selectively grown layer to a growth preventing mask width W is greater than 1.2.

BRIEF DESCRIPTION OF THE DRAWINGS

FIG. 3 is a plan view illustrating a semiconductor photonic integrated circuit fabricated by a method of a first preferred embodiment according to the invention.

DETAILED DESCRIPTION OF THE PREFERRED EMBODIMENTS

Figure 1:
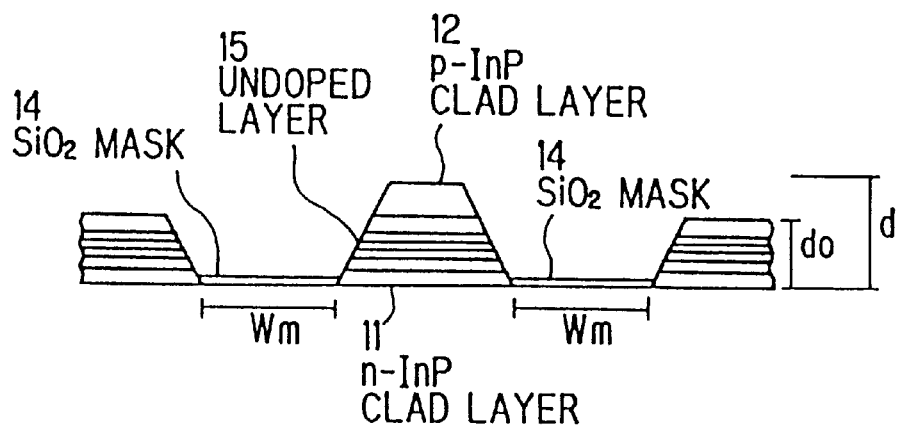
FIG. 1 is a cross-sectional view showing the structure of a semiconductor photonic integrated circuit, used for explaining a theory based on which the invention is made.

First of all, the theory of the invention is now explained. FIG. 1 shows a photonic integrated circuit which includes clad layers 11 and 12, a mask layer 14 having a width of Wm and an undoped layer 15. The invention is based on the theory that dependency of the thickness of the selectively grown layers (11, 12, and 15) and bandgap energy on the width of the mask layer 14 are changed in response to variation of growth pressure of the selectively grown layers (11, 12 and 15). That is, the quantum well structure layer (15), required to have great variation of bandgap energy, is selectively grown with a high growth pressure, in which normalized thickness d/do of a selectively grown layer to a growth preventing mask width is greater than 1.2, to develop the dependency of bandgap energy on the width of the mask 14. The clad layers 11 and 12, not required to have great variation of bandgap energy, are selectively grown with a low growth pressure, in which the normalized thickness d/do of a selectively grown layer to a growth preventing mask width W is smaller than 1.2, to restrain the increase of the thickness of the selectively grown layers (11, 12 and 15). That can be called "dynamic pressure control type of selective MOVPE technology".

Figure 2:
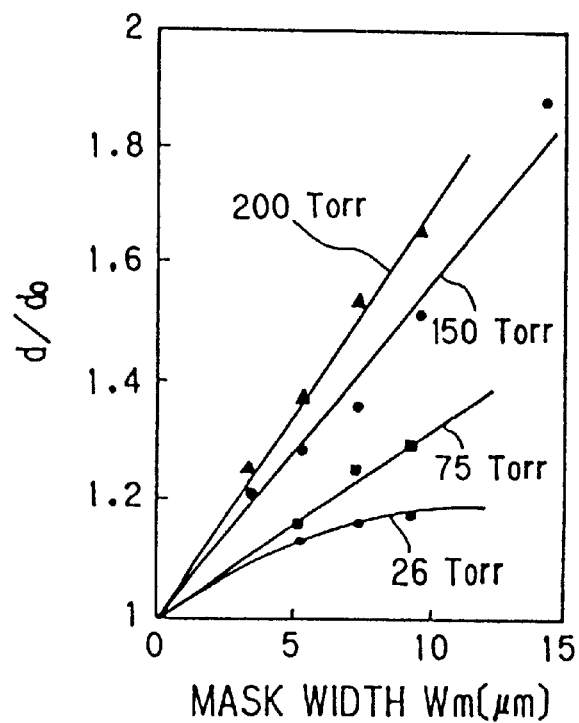
FIG. 2 is a graph showing the growth pressure dependency of a growth preventing mask width W to a normalized thickness d/do in the integrated circuit, used for explaining a theory based on which the invention is made.

FIG. 2 is a graph showing the growth pressure dependency of a growth preventing mask width W to a normalized thickness d/do in the integrated circuit, used for explaining a theory based on which the invention is made.

A thickness of the selectively grown layer on a semiconductor substrate is d, and a thickness of a grown layer out of a growth preventing mask is do. The normalized thickness is disclosed as d/do. When a growth pressure is greater than 25 Torr, the dependency of the normalized thickness d/do to the growth preventing mask width W is increased in accordance with the increase of the growth pressure.

When a growth pressure is smaller than 25 Torr, the normalized thickness d/do is independent from the growth preventing mask width. Accordingly, the normalized thickness d/do is about 1.2 in this case.

Generally, it has been understood that variation AE of bandgap energy relative to variation of the width of the mask changed in response to variation of growth pressure in the selective MOVPE growth processing, because the balance between consumption, diffusion and re-evaporation of growth species is changed in response to variation of the growth pressure.

In more detail, when the flowing speed of growth species gas is lowered by increasing the growth pressure, the concentration gradient in the phase is developed, and therefore, diffusion of the growth species in a lateral direction to the axis of the selectively grown layer is increased and variation AE of bandgap energy relative to variation of the width of the mask is changed dramatically. At the same time, the amount of the growth species re-evaporated from the mask is restrained, so that more amount of growth species is supplied to the selectively grown layers.

According to the invention, none of the following advantages of the selective MOVPE growth technique is lost:

(a) No wet-etching of a semiconductor layer is required, so that the yield and stability of device fabrication are good, (b) No useless excess loss is provided, because no plasma damaged layer is formed by dry-etching of a conductive layer, (c) There is no scattering loss because a light waveguide is naturally formed to have a very flat surface in growth processing, and (d) There is no optical reflection at a joint portion of light waveguides formed by alternative growth processing.

Figure 4A:
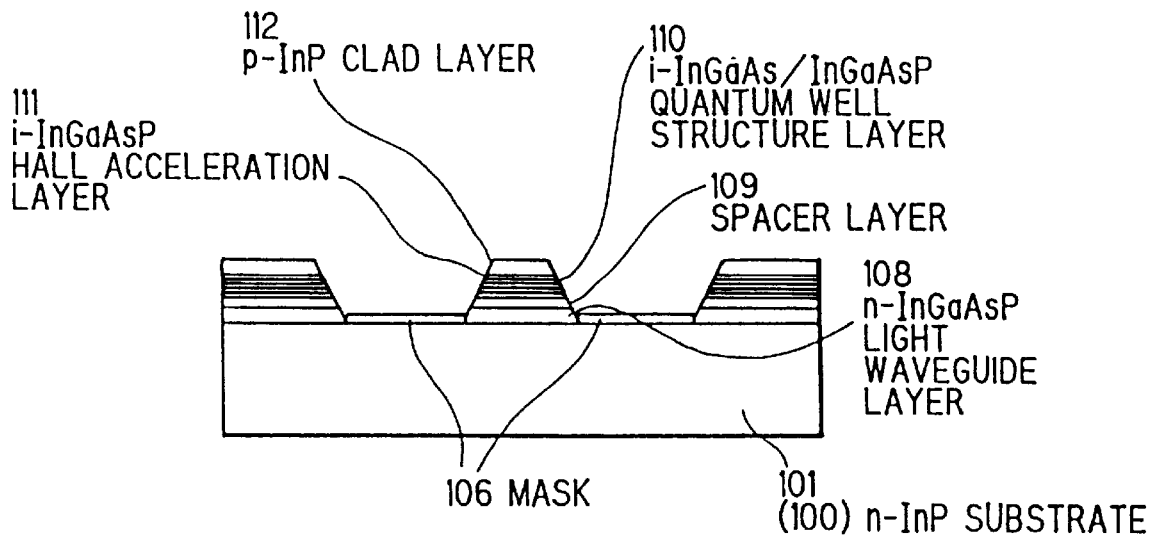
FIGS. 4A to 4C are cross-sectional views illustrating fabrication steps of the first preferred embodiment.
Figure 4B:
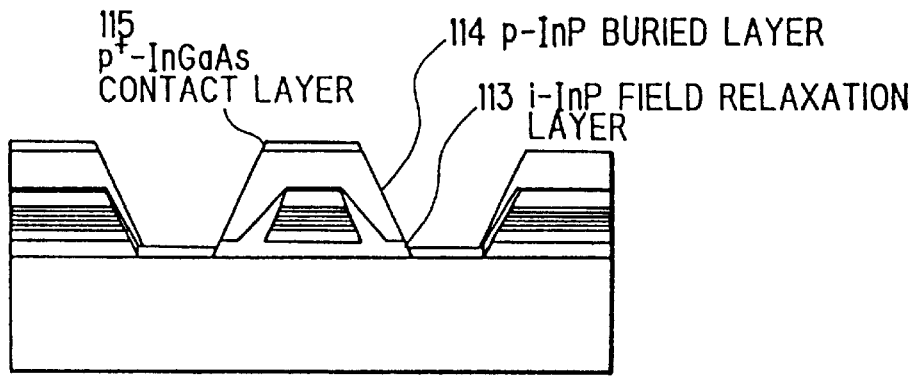
Figure 4C:
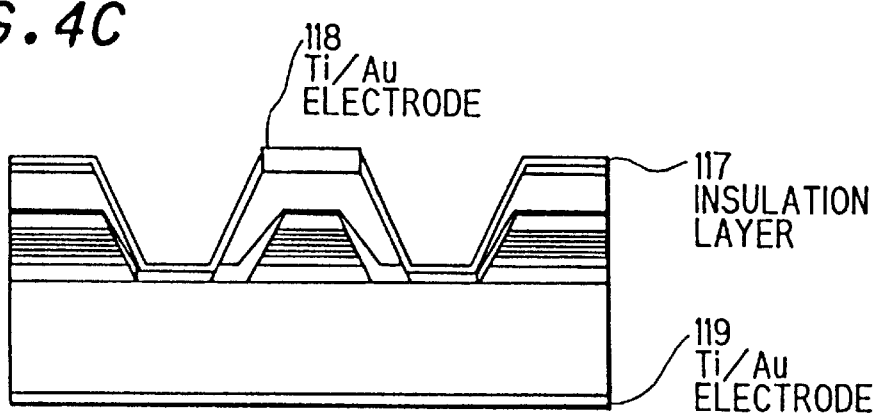
Figure 5:
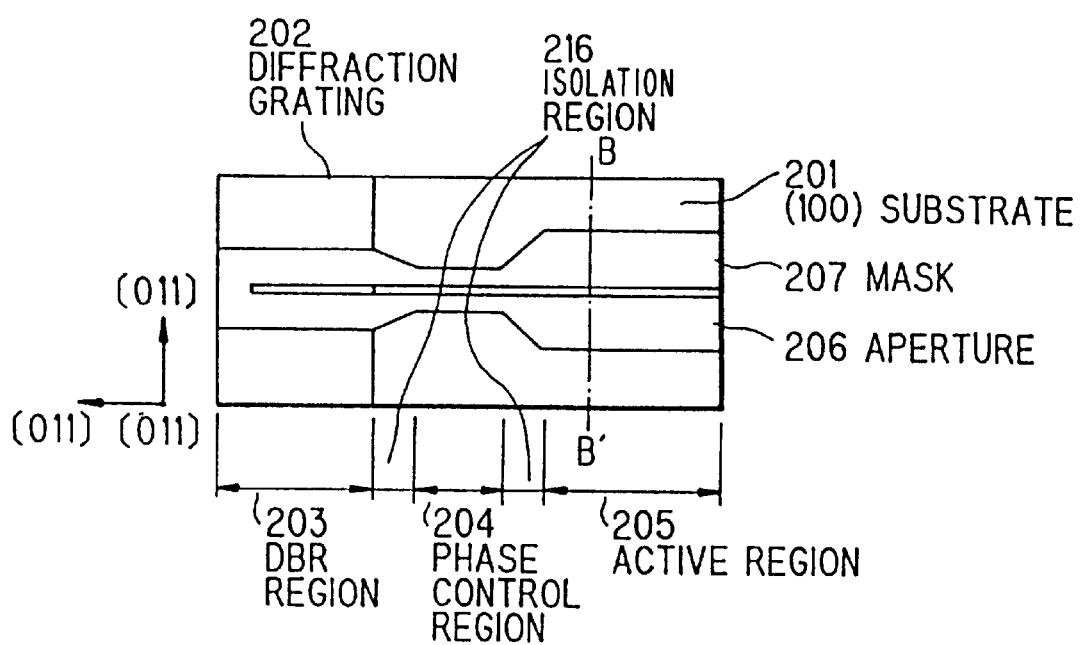
FIG. 5 is a plan view illustrating a semiconductor photonic integrated circuit fabricated by a method of a second preferred embodiment according to the invention.

Next, first and second preferred embodiments of the invention are described. FIG. 3 shows an integrated light source, fabricated by monolithic integration of an electro absorption type of optical modulator and a DFB (Distributed Feedback) laser, according to the first preferred embodiment. FIGS. 4A to 4C show the fabrication steps of the integrated light source shown in FIG. 3.

In fabrication, a diffraction grating 102 is partially formed on an n-InP substrate 101, having a [100] surface, to have a period of 240 nm in a [011] direction and a depth of 30 nm. The area on which the diffraction grating 102 is formed is used as a DFB laser region 103, and the other region is used as an optical modulator region 104. A $SiO_2$ layer is formed on the substrate by heat CVD technique. By photolithography and etching technique, a growth preventing mask 106 is provided thereon. The growth preventing mask 106 has a stripe-shaped aperture 105 having a width 2 μm, and the width of both sides of the aperture 105 is 17 μm on the DFB laser region 103 and of 8 μm on the optical modulator region 104. Further, a longitudinal direction of the aperture 105 is parallel to the [011] direction of the n-InP substrate 101. A window region 107 is formed on the substrate at an area located at 15 μm from a facet of the optical modulator region 107 by forming no aperture thereat, as shown in FIG. 3. That is, a width of the growth preventing mask 106 is different on a DFB laser region and other region and the stripe shaped aperture is positioned at center of the growth preventing mask 106. The mask 106 extends in parallel to [011] direction of the n-InP substrate 101.

Subsequently, as shown in FIG. 4A, by using a low pressure MOVPE (LP-MOVPE) apparatus, an n-InGaAsP light waveguide layer 108 having a wavelength composition of 1.15 μm and a thickness of 100 nm, an n-InP spacer layer 109 having a thickness of 40 nm, an undoped multiple quantum well layer 110 of 7 periods composed of an undoped InGaAsP barrier layer having a wavelength composition of 1.3 μm and a thickness of 10 nm and an undoped InGaAs well layer having a thickness of 7 nm, an undoped InGaAsP hole acceleration layer 111 having a wavelength composition of 1.15 μm and a thickness of 40 nm, and a p-InP clad layer 112 having a thickness of 200 nm are continuously MOVPE-grown on a stripe portion of the substrate exposed from the aperture 105. In this growth processing, the N-InGaAsP light waveguide layer 108, n-InP spacer layer 109, undoped InGaAsP hole acceleration layer 111 and p-InP clad layer 112 are grown at a pressure of 25 Torr, but the undoped multiple quantum well layer 110 is grown at a pressure of 150 Torr. The growth condition is controlled so that the undoped InGaAs well layer and the undoped InGaAsP barrier layer are lattice-matched with the n-InP substrate 101 on the DFB laser region 103. The undoped quantum well region 110 has bandgap wavelengths of 1.55 μm and 1.48 μm on the DFB laser region 103 and the optical modulator region 104, respectively.

Next, as shown in FIG. 4B, the aperture 105 is expanded in width to 7 μm and 5 μm on the DFB laser region 103 and the optical modulator region 104, respectively, by photolithography and etching processing. On the stripe portion of the substrate exposed from the expanded aperture 105, an undoped InP field relaxation layer 113 having a thickness of 40 nm, a p-InP buried layer 114 having a thickness of 1.4 μm and a p+ InGaAs contact layer 115 having a thickness of 200 nm are selectively grown by the MOVPE technique. In order to electrically isolate the DFB laser region 103 and optical modulator region 104 from each other, the p+ InGaAs contact layer 115 is partially removed 25 μm from the boundary thereof to the optical modulator region to form an isolation region 115, shown in FIG. 3.

Next, as shown in FIG. 4C, an insulation layer 117 is provided over the entire structure to have a thickness of 0.3 μm, a top portion of the insulation layer 117 is etched by photolithography and removed to expose the p+ InGaAs contact layer. A Ti/Au electrode 118 is coated and patterned by photolithography and etching technique. The n-InP substrate 101 is lapped to 100 μm, and then a Ti/Au electrode 118 is coated on the rear surface thereof.

Consequently, a low reflection coating and a high reflection coating are provided on the facets of the optical modulator region and the DFB laser region, respectively. In this embodiment, each thickness of layer represents a thickness of a layer selectively grown on the aperture in the DFB laser region.

In thus fabricated integrated light source, when current is injected into the DFB laser region 103, single mode oscillation is performed with a wavelength which is determined by an effective refractive index which is calculated based on the pitch of the diffraction grating 102 and the cross-sectional structure thereof. The undoped quantum well layer 110 (light absorption layer) in the optical modulator region 104 has a bandgap wavelength of 1.48 μm in order to restrain light absorption in non bias condition. When field is applied to the light absorption layer, absorption coefficient for transmission light is increased by QCSE (Quantum-Confined Stark Effect), so that the structure can operate as a light intensity modulator.

When 3V reverse voltage is applied to the optical modulator region 103, the light absorption layer is biased by high field of 200 kV/cm, and therefore, light absorption coefficient for 1.55 μm lasing wavelength is increased by 4300 $cm^{-1}$ by QCSE. A light confinement factor of the seven layered well layer is 4%, so that 15 dB of extinction ratio is obtained with 200 μm of device length.

Generally, when a light is reflected at the output facet of the optical modulator region, the light is reflected back and forth in the optical modulator region 104 and fed back to the DFB laser region 103. If this kind of light feedback is changed in dynamic in light intensity modulation, the waveform of light signal, which has been transmitted in an optical fibre in a long distance communication, is degraded by spectral charping phenomena in which lasing wavelength is fluctuated in the modulation processing. In order to avoid this kind of problem, less than 0.1% of reflectivity is required at the output facet of the optical modulator region, however, it is generally difficult to obtain the reflection rate. According to the invention, the window region 107 providing no light confinement in transverse direction is provided, so that a light launched thereto is spread and led to the facet of the optical modulator region 104. Only a light reached in 90 degree angle to the facet surface can be reflected and be re-coupled to the optical modulator region 104, so that less than 0.1% of reflectivity can be easily realized with a conventional low reflection coating.

In the above mentioned embodiment, the DFB laser region 103 provides single mode oscillation at 1.55 μm of lasing wavelength and 10 mA of threshold current. This means that the coupling efficiency between the DFB laser region 104 and the optical modulator region 104 is 100% and over 10 mW of output power is obtained from the facet of the modulator region. The isolation resistance between the DFB laser region 103 and the optical modulator laser 104 is 10 kΩ, which makes good electrical isolation with no problem in practical use. When a 80 km fiber transmission was tested in 2.5 Gb/s band with the invented integrated light source, wavelength charping phenomena is restrained sufficiently, and therefore, high quality transmission performance could be realized.

Next, a second preferred embodiment according to the invention is now described in conjunction with FIGS. 5 and 6A to 6C. This embodiment is on a tunable type of DBR laser. In fabrication, a diffraction grating 202 is partially formed on an n-InP substrate 201 of a [100] surface, to have a period of 240 nm in a [011] direction and a depth of 30 nm. The area on which the diffraction grating 202 is formed is used as a DBR, and one half of the other area closer to the DBR region is used as a phase control region 204 and the other half is used as an active region 205. An $SiO_2$ layer is formed on the substrate by heat CVD technique. By photolithography and etching techniques, a growth preventing mask 207 is provided thereon. The growth preventing mask 207 has a stripe-shaped aperture 206 having a width 2 μm, and the width of both sides of the aperture 206 is 12 μm on the DFB laser region 203, of 8 μm on the phase control region 204 and of 17 μm on the active region 205. That is, a width of the growth preventing mask 207 is varied on each regions and the stripe shaped aperture 206 is positioned at center of the growth preventing mask 207. Further, a longitudinal direction of the aperture 206 is parallel to the [011] direction of the n-InP substrate 201.

Figure 6A:
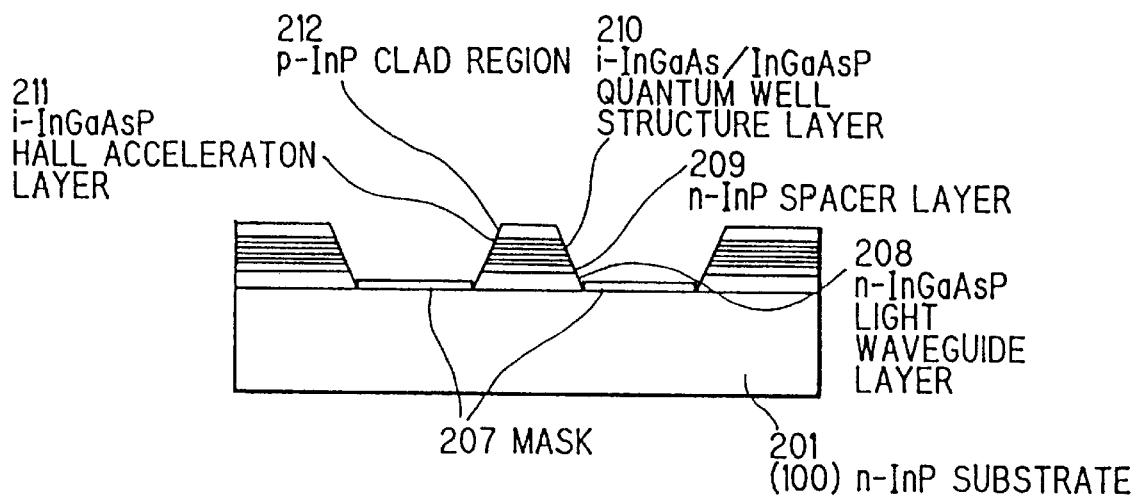
FIGS. 6A to 6C are cross-sectional views illustrating fabrication steps of the second preferred embodiment.

Subsequently, as shown in FIG. 6A, by using a low pressure MOVPE apparatus, an n-InGaAsP light waveguide layer 208 having a wavelength composition of 1.15 μm and a thickness of 100 nm, an n-InP spacer layer 209 having a thickness of 40 nm, an undoped multiple quantum well layer 210 of 7 periods composed of an undoped InGaAsP barrier layer having a wavelength composition of 1.3 μm and a thickness of 10 nm, and an undoped InGaAs well layer having a thickness of 7 nm, an undoped InGaAsP hole acceleration layer 211 having a wavelength composition of 1.15 μm and a thickness of 40 nm, and a p-InP clad layer 212 having a thickness of 200 nm are continuously MOVPE-grown on the stripe portion of the substrate exposed from the aperture 206. In this growth processing, the n-InGaAsP light waveguide layer 208, n-InP spacer layer 209, undoped InGaAsP hole acceleration layer 211 and p-InP clad layer 212 are grown at a pressure of 25 Torr, but the undoped multiple quantum well layer 210 is grown at a pressure of 150 Torr. The growth condition is controlled so that the undoped InGaAs well layer and the undoped InGaAsP barrier layer are lattice-matched with the n-InP substrate 201 on the active region 205. The undoped multiple quantum well region 210 has bandgap wavelengths of 1.51 μm, 1.48 μm and 1.55 μm on the DBR region 203, the phase control region 204 and the active region 205, respectively.

Figure 6B:
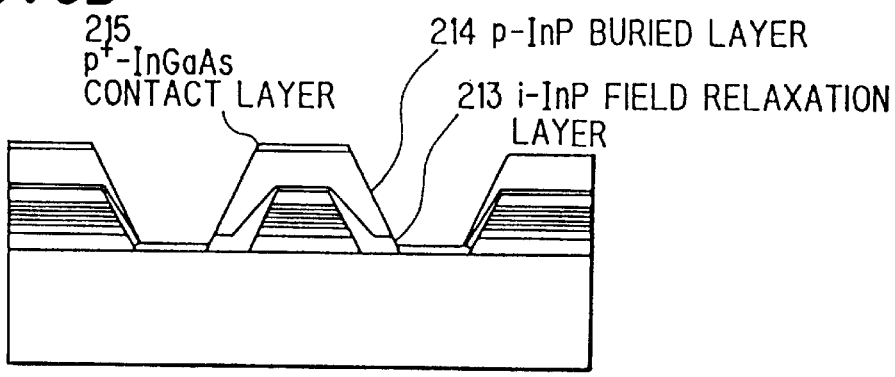

Next, as shown in FIG. 6B, the mask 207 is continuously etched from the inside thereof for each 2 μm to expand the aperture 206 in width. On the stripe portion of the substrate exposed from the expanded aperture 206, an undoped InP spacer layer 213 having a thickness of 40 nm, a p-InP buried layer 214 having a thickness of 1.4 μm and a p+ InGaAs contact layer 215 having a thickness of 200 nm are selectively grown by MOVPE technique. In order to electrically isolate those regions from each other, the p+ InGaAs contact layer 215 is partially removed 25 μm from the boundary portions of those regions to form an isolation region, shown in FIG. 5.

Figure 6C:
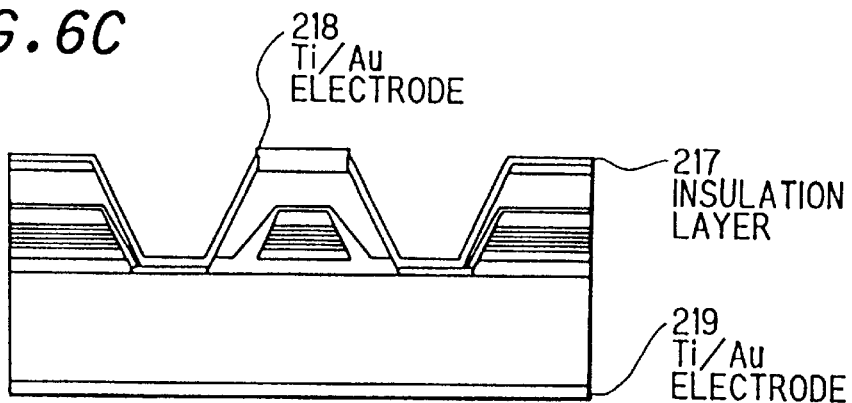

Next, as shown in FIG. 6C, an insulation layer 217 is provided over the entire structure to have a thickness of 0.3 µm, then a top portion of the insulation layer 217 is etched by photolithography and removed to expose the p+ InGaAs contact layer. A Ti/Au electrode 219 is coated and patterned by photolithography and etching technique. The n-InP substrate 101 is lapped to 100 µm, and then a Ti/Au electrode 219 is coated on the rear surface thereof.

Consequently a low reflection coating and a high reflection coating are provided on the facets of the DBR region and active region, respectively. In this embodiment, each thickness of layer represents a thickness of a layer selectively grown on the aperture in the active region.

In thus fabricated tunable DBR laser, when current is injected into the active region 205, single mode oscillation is performed with a wavelength which is determined by an effective refractive index, which is calculated based on the pitch of the diffraction grating 202 and the cross-sectional structure of the DBR region 203. When current is injected into the DBR region 203, the lasing wavelength changes toward shorter wavelength in discrete fashion in accordance with alternative axis mode jumping with reduction of the refractive index by plasma dispersion effect. When phase matching condition of light transmitting back and forth in the cavity is controlled by adjusting current to be supplied to the phase control region 204, fine tuning can be realized even within leasing wavelength which has changed in discrete fashion, and therefore, virtual continuous turning operation of lasing wavelength can be realized.

In the tunable DBR laser, when 15 mA of current is supplied into the active region 205, a single longitudinal mode oscillation is obtained with 15 mW of maximum light output. When 60 mA of current is supplied into the DBR region 203, 7 nm of maximum tunable range is achieved. At the same time, current is supplied into the phase control region 204, virtual continuous turning operation of lasing wavelength can be realized.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A method for fabricating a semiconductor photonic integrated circuit, comprising the steps of:

(a) providing a growth preventing mask on a semiconductor substrate, said growth preventing mask being shaped with a first portion of a first width and a second portion of a second width wider than said first width, said first and second portions having a non-masked stripe aperture extending through said second portion and part of said first portion;

(b) selectively growing a light waveguide layer on said non-masked stripe aperture of said semiconductor substrate by an epitaxial growth technique using a first growth pressure which is below a minimum growth pressure required to cause $d/d_o$ to increase as the mask width is increased, where d is the thickness of a selectively grown layer in said non-masked stripe aperture, and $d_o$ is the thickness of said selectively grown layer outside of said mask;

(c) increasing a growth pressure to a second growth pressure above said minimum growth pressure;

(d) selectively growing a multiple quantum well structure layer on said light waveguide layer by an epitaxial growth technique using the second growth pressure;

(e) decreasing said growth pressure to a pressure below said minimum growth pressure; and (f) selectively growing a clad layer on said multiple quantum well structure layer by the epitaxial growth technique using said first growth pressure below said minimum growth pressure, wherein said steps a) to f) are successively carried out in a depressurized MOVPE (Metalorganic Vapor Phase Epitaxy) apparatus.

2. The method according to claim 1, further comprising the step of:

providing an electrode structure for injecting current or applying voltage to said multiple quantum well structure layer.

3. The method according to claim 1, further comprising the step of:

providing an optical modulator region in which a low reflection coating is formed on its facet, the facet of the optical modulator region being provided with a window region in which no optical waveguide structure is formed so as to spread a light output from the optical waveguide structure to the low reflection coating.

4. The method according to claim 1, wherein:

said semiconductor photonic integrated circuit is an integrated light source including an electro absorption type of optical modulator and a DFB (Distributed Feedback) laser which are integrated in a monolithic manner.

5. The method according to claim 1, wherein:

said semiconductor photonic integrated circuit is a tunable DBR (Distributed Bragg Reflection) laser.

6. The method according to claim 1, wherein said minimum pressure is approximately 26 Torr.

7. The method according to claim 1, wherein the minimum growth pressure is a minimum pressure required to cause the ratio d/do to increase beyond 1.2 with an increase in the mask width.

\* \* \* \* \*